United States Patent [19]

Boon et al.

[11] Patent Number: 4,816,779
[45] Date of Patent: Mar. 28, 1989

[54] AMPLITUDE STABILIZED OSCILLATOR HAVING POSITIVE AND NEGATIVE FEEDBACK

[75] Inventors: Cornelis A. M. Boon, The Hague; Ernst H. Nordholt, Berkel & Rodenrijs, both of Netherlands

[73] Assignee: U.S. Philips Corp., New York, N.Y.

[21] Appl. No.: 92,810

[22] Filed: Sep. 3, 1987

[30] Foreign Application Priority Data

Sep. 9, 1986 [NL] Netherlands ............ 8602263

[51] Int. Cl.[4] .................................. H03L 5/00
[52] U.S. Cl. .................... 331/109; 331/117 R; 331/167; 331/183; 332/55
[58] Field of Search ............ 331/117 R, 117 FE, 167, 331/168, 109, 183, 135–142, 116 R, 116 FE, 158, 159; 332/31 R, 31 T, 55

[56] References Cited

U.S. PATENT DOCUMENTS

| 3,500,246 | 3/1970 | Werner | 331/141 X |
| 3,761,741 | 9/1973 | Hoeft | 307/237 |
| 4,419,634 | 12/1983 | Druegh et al. | 331/117 R |
| 4,672,449 | 6/1987 | Kraus et al. | 358/148 |

FOREIGN PATENT DOCUMENTS 2044275 2/1971 France .

Primary Examiner—Siegfried H. Grimm
Attorney, Agent, or Firm—Bernard Franzblau

[57] ABSTRACT

An oscillator circuit which includes a differential amplifier in combination with a negative feedback network and a positive feedback network connected to the amplifier. One of these networks determines the frequency of the generated oscillation. In order to obtain an oscillation of constant amplitude, the negative feedback network comprises a current limiter active as a controllable one-port network which is connected between the negative feedback input of the differential amplifier and a fixed potential.

20 Claims, 1 Drawing Sheet

AMPLITUDE STABILIZED OSCILLATOR HAVING POSITIVE AND NEGATIVE FEEDBACK

BACKGROUND OF THE INVENTION

This invention relates to an oscillator circuit comprising a differential amplifier having a negative feedback input, a positive feedback input and an output, a first feedback network connected between the output and one of the inputs, which network determines the frequency of the generated oscillation, a second feedback network connected between the output and the other input, and a limiter element forming part of one of the feedback networks.

An oscillator circuit of this type is known from French Patent Specification No. 2,044,275. For generating an oscillation at a constant amplitude a part of the voltage at the output of the differential amplifier in this known circuit is fed back to the non-inverting (the positive feedback) input of the amplifier. The frequency-determining network is a rejection circuit which forms part of a feedback network connected to the inverting (the negative feedback) input of the differential amplifier. At the resonant frequency of the rejection circuit the negative feedback is at a minimum, thus oscillation is produced.

In this circuit the positively fed-back voltage is limited by means of Zener diodes. The voltages across these diodes must be equal and must remain equal in spite of possible variations which may be caused by tolerances, ageing, temperature fluctuations, etc. Moreover, these voltages and not easily controllable.

SUMMARY OF THE INVENTION

It is an object of the invention to provide an oscillator circuit of the type described above in which the limiter is formed in a simple manner as an accurately controllable element. To this end an oscillator circuit according to the invention is characterized in that the feedback network of which the limiter element is part is a negative feedback network, the limiter element being a controllable current limiter active as a controllable one-port network which is connected between the negative feedback input of the differential amplifier and a fixed potential.

The invention is based on the recognition that the limit value of the current can be adjusted in a simple and accurate manner by means of such a current-limiting element, while the one-port network according to the invention can be incorporated in an integrated circuit.

The limiter element may be a non-linear resistor through which a current flows in opposite directions at substantially the same intensity during the two halves of the period of the generated oscillation. The current through the non-linear resistor may be adjustable for adjusting the amplitude of the generated oscillation. The current through the non-linear reesistor may be made to undergo a predetermined variation in order to modulate the amplitude of the generated oscillation.

In a simple embodiment an oscillator circuit according to the invention is characterized in that the non-linear resistor is in the form of a first and a second transistor whose emitters are coupled together and to an adjustable current source, while the base of the first transistor is connected to the fixed potential and the base and the collector of the second transistor are coupled together and to the negative feedback input of the differential amplifier. The two collectors of the transistors are connected to a current mirror circuit. It is to be noted that such a configuration is known per se from U.S. Pat. No. 3,761,741, but not as part of an oscillator.

In a first embodiment the frequency-determining network comprises a series resonant network connected between the output and the positive feedback input of the differential amplifier and a first resistor connected between the same input and the fixed potential, while the second feedback network comprises a second resistor connected between the output and the negative feedback input of the differential amplifier. In this case the sinusoidal current flowing through the series resonant network is the output signal of the circuit.

In a second embodiment the frequency-determining network comprises a parallel resonant network connected between the positive feedback input of the differential amplifier and the fixed potential, while the series arrangement of two impedances is connected between the two inputs of the differential amplifier and a load is provided between the output of the differential amplifier and the junction point of the impedances. In this case the current through the load may be the output signal of the circuit.

In a third embodiment the frequency-determining network comprises a parallel resonant network connected between the output and the negative feedback input of the differential amplifier, while the second feedback network comprises a first impedance connected between the output and the positive feedback input of the differential amplifier and a second impedance connected between the same input and the fixed potential. In this case the voltage prevailing between the output of the differential amplifier and the fixed potential is the output signal of the circuit.

An oscillator circuit according to the invention being in the form of a semiconductor body is preferably characterized in that all said elements of the circuit, except for the reactive elements which form part of the frequency-determining network, are integrated in the semiconductor body. As a rule, the frequency-determining network comprises inductances and capacitors, but all other components of the oscillator circuit are easily integratable.

BRIEF DESCRIPTION OF THE DRAWING

The invention will be described in greater detail by way of example with reference to the accompanying drawings. In these drawings.

DESCRIPTION OF THE PREFERRED EMBODIMENTS

Figure 1:
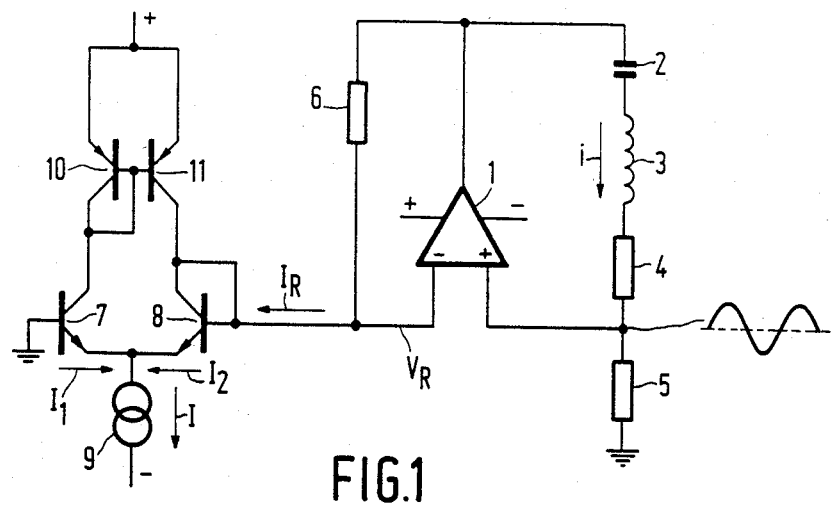
FIG. 1 shows a first embodiment of an oscillator circuit according to the invention.

In FIG. 1 the reference numeral 1 denotes a differential amplifier having a high gain factor. The series arrangement of a capacitor 2, an inductance 3 and a resistor 4 is connected between a non-inverting input and an output of the amplifier 1, where resistor 4 comprises the losses of capacitor 2 and inductance 3. A resistor 5 is connected between the same input and a fixed potential, for example, ground and a resistor 6 is disposed between the inverting input and the output of amplifier 1. Finally, a circuit to be described hereinafter is connected between the inverting input and ground, which circuit will be tentatively denoted as a resistor R. For its energy supply amplifier 1 is connected to a positive and a negative voltage.

It is apparent from the foregoing that during operation a part of the voltage at the output of amplifier 1 is negatively fed back to the inverting input, which part depends on the values of resistors 6 and R and that another part of the output voltage is positively fed back to the noninverting input, which other part depends on the impedance of the series arrangement 2, 3, 4 and on the value of resistor 5. The (small) difference between the positively fedback voltage and the negatively fedback voltage is amplified by amplifier 1 for supplying the output voltage. At the series resonant frequency of the series network 2, 3 the value of the positively fedback voltage is highest. It will be evident that in a suitable design in which the gain factor of amplfier 1 is also one of the parameters, the described circuit is an oscillator. A sinusoidal current at the said frequency flows through the series arrangement 2, 3, 4 and due to the high gain of the amplifier 1 substantially the same current flows through resistor 5, whereas substantially no current flows to the non-inverting input.

The properties of the oscillator are determined to a great extent by the passive circuit elements which must therefore be accurate. The active part of the circuit, i.e. amplifier 1, may be inaccurate but it must have much power amplification for generating a considerable current through the series feedback arrangement. For satisfactorily fixing the amplitude of this current, resistor R must be an accurate non-linear element which thus functions as a limiter. In order not to influence the frequency of the oscillator this element must also be frequency-independent, in other words, it must indeed behave as a resistor.

For realizing resistor R, the emitters of two nontransistors 7 and 8 are connected together and to a current source 9 which is connected to a negative supply voltage at the other end. The base of transistor 7 is connected to ground and that of transistor 8 is connected to its collector and to the junction point of resistor 6 and the inverting input of amplifier 1. The collector of transistor 7 is connected to the base and to the collector of a pnp-transistor 10 whose emitter is connected to a positive supply voltage. The emitter of a further pnp-transistor 11 is connected to the said positive voltage while its base is connected to the base and the collector of transistor 10 and the collector of transistor 11 is connected to the base and the collector of transistor 8.

Figure 2:
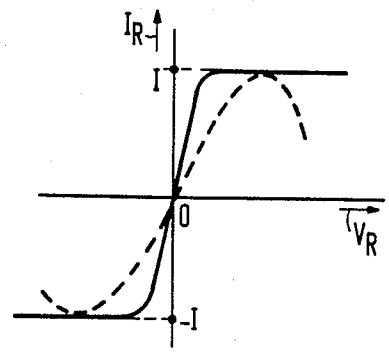
FIG. 2 shows the characteristic curve of a non-linear resistor forming part of the circuit of FIG. 1, and FIGS. 3 and 4 show second and third embodiments of an oscillator circuit according to the invention with the said non-linear resistor forming a part thereof.

The current I of source 9 is equal to the sum of the emitter current $I_1$ of transistor 7 and the emitter current $I_2$ of transistor 8. Transistors 10 and 11 constitute a current mirror circuit so that the collector current of transistor 11 is substantially equal to current $I_1$. Thus a current $I_R = I_2 - I_1$ flows to the base of transistor 8. Due to the high gain factor of amplifier 1 the two input voltages thereof are little different. The voltage $V_R$ at the inverting input thus has a shape which is the same as that of the current i through the resonant network 2, 3, 4, i.e. sinusoidal. During the positive half cycle of voltage $V_R$ transistors 7, 10 and 11 do not convey current and current $I_1$ is zero so that $I_2 = I$. Current $I_R$ is equal to I and flows through the collector-emitter path of transistor 8 to the source 9. During the negative half cycle of voltage $V_R$ transistor 8 does not convey current and current $I_2$ is zero so that $I_1 = I$. Current $I_R$ is equal to $-I$ and flows from the collector of transistor 11 to the junction point of resistor 6 and the inverting input of amplifier 1. It is evident therefrom that the circuit made up of elements 7 to 11 behaves as a non-constant resistor $R = (V_R/I_R)$ between the said inverting input and ground, the potential level of source 9 being of no importance in view of the high impedance of this source. A square-shaped current whose intensity is I flows through resistor R. It flows in the given direction when current i flows to ground and it flows in the opposite direction when current i flows to the output of amplifier 1, even if voltage $V_R$ varies sinusoidally. FIG. 2 shows the current-voltage characteristic curve of resistor R in this embodiment by means of a solid line. Transistors 7 and 8 constitute a switching differential amplifier so that the voltage range of the characteristic curve in which $I_R$ is not equal to I and $-I$ is very narrow.

Due to the high gain of amplifier 1 substantially the same current as flows through resistor R flows through resistor 6. The voltage across this resistor is thus square-shaped at the same frequency as current i. It is apparent therefrom that the voltage across the series arrangement 2, 3, 4 is also square-shaped. The amplitude of this voltage is proportional to current I and to the value of resistor 6. The same applies to the amplitude of current i. By adjusting the value of current I, for example, because source 9 is formed with a transistor whose base voltage is adjustable, the amplitude of current i can therefore be adjusted to a substantialy constant value. This amplitude may be rendered variable in a desired manner in that current I undergoes the same variation. Thus, current i can be amplitude-modulated, the envelope having a lower frequency than the frequency of the oscillator described because current I is varied at this lower frequency.

The foregoing implies that the sinusoidal current i is the output signal of the oscillator. By suitable design a large power can be obtained with the circuit described. For the output signal of the oscillator it is also possible to choose the sinusoidal voltage which is present across resistor 5 or the square-shaped voltage which is present across a winding coupled to inductance 3, provided, however, that a load connected to resistor 5 or to the said winding, respectively, does not adversely affect or hardly effects the value of the resonant frequency and/or the constancy shape of the amplitude.

Figures 3, 4:
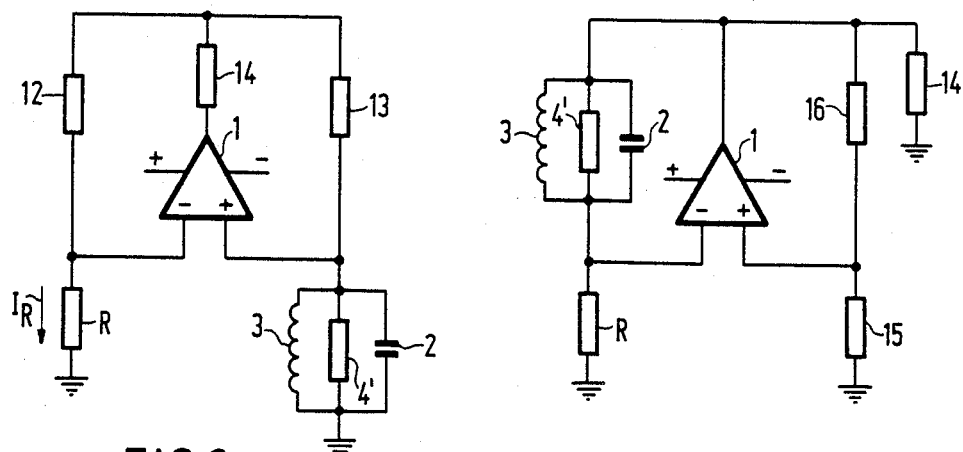

FIG. 3 shows a modification of the circuit of FIG. 1 with the same elements 1, 2 and 3 as in FIG. 1. In FIG. 3 inductance 3 and capacitor 2 constitute a parallel resonant circuit with a resistor 4' comprising the losses of the circuit connected parallel thereto. Elements 2, 3, and 4' are connected between the non-inverting input to amplifier 1 and ground. The circuit formed by elements 7 to 11 and designated by a resistor R in FIG. 3 is connected between the inverting input of amplifier 1 and ground. Furthermore, an impedance 12 is connected to the inverting input and an impedance 13 is connected to the non-inverting input. Impedances 12 and 13 are connected together at the other end and to an impedance 14 which is connected at the other end to the output of amplifier 1.

During operation a part of the output voltage of amplifier 1 is positively fed back in the circuit of FIG. 3, which part is at a maximum at the parallel resonant frequency of the circuit 2, 3. In the case of a suitable design the circuit oscillates, a sinusoidal voltage at the said frequency being present at the non-inverting input of the amplifier. A voltage which is substantially equal thereto is thus present at the other input. A current $I_R$ flows through resistor R and also through impedance 12 and has the value I determined by source 9 during the positive half cycles of the sine waveform and the value $-I$ during the negative half cycles. Under these circumstances the voltage across impedance 12 and hence the voltage across the impedance 13 is square-shaped at the frequency of the sine waveform. Square-shaped currents flow through impedances 12 and 13, the current through impedance 13 being equal to the current through impedance 12 multiplied by the ratio $(Z_{12}/Z_{13})$ of the respective values of impedances 12 and 13. A square-wave current at the same frequency as the sine waveform and at an amplitude which is equal to the amplitude of the current through impedance 12 multiplied by a factor $1+(Z_{12}/Z_{13})$ flows through impedance 14. Impedance 14 may be a load. The square-shaped current therethrough is the output signal of the oscillator. Possible variations of the load do not affect this current. It must hold for the circuit of FIG. 3 that the ratio $(Z_{12}/Z_{13})$ is independent of the frequency. In the simplest case the reference numerals 12 and 13 designate resistors.

In the modification of FIG. 4 the parallel circuit 2, 3, 4' is disposed between the inverting input and the output of amplifier 1. Resistor R is connected between the same input and ground and an impedance 15 is connected between the non-inverting input and ground. A further impedance 16 is disposed between the non-inverting input and the output to which output the load 14 is connected. Load 14 is connected to ground at the other end. In FIG. 4 the circuit oscillates because the negative feedback is at a minimum at the parallel resonant frequency of the circuit 2, 3. Sinusoidal voltages having the said frequency prevail across the circuit and hence across impedance 16 and consequently across impedance 15 and across resistor R, the voltage across impedance 15 being equal to the voltage across impedance 16 multiplied by the ratio $(Z_{15}/Z_{16})$ of the respective values of these impedances. The voltage at the output of amplifier 1 is also sinusoidal with an amplitude which is equal to the amplitude of the voltage across impedance 16 multiplied by a factor $1+(Z_{15}/Z_{16})$ and is thus proportional to the current I of source 9 and to the value of resistor 4'. The voltage at the said output is the output signal of the circuit of FIG. 4 and is independent of possible variations of the value of the impedance 14 connected thereto. For this circuit it must hold that the ratio $(Z_{15}/Z_{16})$ is independent of the frequency. In the simple case in which impedances 12 and 13 (FIG. 3) and 15 and 16 (FIG. 4) are resistors, all elements of the circuit, with the exception of inductance 3 and capacitor 2 and possibly load 14, can be integrated in a semiconductor body in which the envisaged accuracy of the elements of the circuit can be achieved.

The current-limiting characteristic curve of FIG. 2 is obtained with the construction of resistor R by means of the circuit formed by elements 7 to 11, while the value of I is important, i.e. the value of current $I_R$ which corrresponds to a voltage $V_R$ which is higher than a given value. It will be evident that circuits having different characteristic curves can be designed. In FIG. 2 such a characteristic curve is shown in a broken line in which the limit value I of current $I_R$ is reached for a given value of voltage $V_R$ and in which current $I_R$ has a value which is lower than I for higher values of voltage $V_R$. It is important that the characteristic curve is odd in order to realize a symmetrical drive of the active part 1 of the circuit.

What is claimed is:

1. An oscillator circuit comprising a differential amplifier having a negative feedback input, a positive feedback input and an output, a first feedback network connected between the amplifier output and one of the amplifier inputs, which network determines the frequency of a generated oscillation, a second feedback network connected between the output and the other amplifier input, one of said feedback networks being a negative feedback network, and a current limiter element forming a part of the negative feedback network, the current limiter element having a V-I characteristic such that an approximately square wave current flows therein whose amplitude is independent of variations in signal level at the amplifier output, said current limiter being active as a controllable one-port network connected between the negative feedback input of the differential amplifier and a fixed potential.

2. An oscillator circuit as claimed in claim 1, characterized in that the current limiter element comprises a non-linear resistor device through which a current flows in opposite directions at substantially the same intensity during the two halves of the period of the generated oscillation.

3. An oscillator circuit as claimed in claim 2, wherein the current through the non-linear resistor device is adjustable for adjusting the amplitude of the generated oscillation.

4. An oscillator circuit as claimed in claim 3, wherein the current through the non-linear resistor device undergoes a predetermined variation for modulating the amplitude of the generated oscillation.

5. An oscillator circuit as claimed in claim 2, wherein the non-linear resistor device comprises a first and a second transistor whose emitters are coupled together and to an adjustable current source, means connecting the base of the first transistor to the fixed potential, the base and the collector of the second transistor being coupled together and to the negative feedback input of the differential amplifier, and means connecting the collectors of the first and second transistors to a current mirror circuit.

6. An oscillator circuit in the form of a semiconductor body, the oscillator circuit being as claimed in claim 1, characterized in that all said elements of the circuit, except for reactive elements which form part of the frequency-determining network, are integrated in the semiconductor body.

7. An oscillator circuit as claimed in claim 1 wherein the limiter element comprises a non-linear resistive device through which a constant amplitude AC current flows, and the first feedback network comprises a series resonant LC network connected between the output and the positive feedback input of the differential amplifier and a first resistor connected between said positive feedback input and the fixed potential, and the second feedback network comprises a second resistor connected between the output and the negative feedback input of the differential amplifier.

8. An oscillator circuit as claimed in claim 7 wherein the non-linear resistive device comprises first and second transistors having emitters coupled together and to an adjustable current source, means connecting the base of the first transistor to the fixed potential, the base and the collector of the second transistor being coupled together and to the negative feedback input of the differential amplifier, and means connecting the collectors of the first and second transistors to a current mirror circuit.

9. An oscillator circuit as claimed in claim 1 wherein the limiter element comprises a non-linear resistive device through which a constant amplitude AC current flows, the first feedback network comprises a parallel resonant network connected between the positive feedback input of the differential amplifier and the fixed potential, means connecting first and second impedance elements in series beteen the two inputs of the differential amplifier, and means coupling a load between the output of the differential amplifier and a junction point of the first and second impedance elements.

10. An oscillator circuit as claimed in claim 9 wherein the impedance ratio of the first and second impedance elements is frequency-independent.

11. An oscillator circuit as claimed in claim 1 wherein the limiter element comprises a non-linear resistive device through which a constant amplitude AC current flows, the first feedback network comprises a parallel resonant LC network connected between the output and the negative feedback input of the differential amplifier, and the second feedback network comprises a first impedance connected between the output and the positive feedback input of the differential amplifier and a second impedance connected between the positive feedback input and the fixed potential.

12. An oscillator circuit as claimed in claim 11 wherein the ratio of the impedance values of the first and the second impedance is frequency-independent.

13. An oscillator circuit comprising:
a differential amplifier having a negative feedback input, a positive feedback input and an output,
a first feedback network connected between the amplifier output and one input of the amplifier, said first network determining the frequency of an oscillation generated by the oscillator circuit,
a second feedback network connected between the amplifier output and the other amplifier input,
one of said feedback networks being a negative feedback network, and
a current limiter element forming a part of the negative feedback network and being active as a controllable one-port network connected between the amplifier negative feedback input and a fixed potential, and wherein
the frequency-determining network comprises a series resonant network connected between the amplifier output and the positive feedback input of the differential amplifier and a first resistor connected between said positive feedback input and the fixed potential, and
the second feedback network comprises a second resistor connected between the output and the negative feedback input of the differential amplifier.

14. An oscillator circuit as claimed in claim 13 wherein a sinusoidal current flowing through the series resonant network is the output signal of the circuit.

15. An oscillator circuit comprising:
a differential amplifier having a negative feedback input, a positive feedback input and an output,
a first feedback network connected between the amplifier output and one input of the amplifier, said first network determining the frequency of an oscillation generated by the oscillator circuit,
a second feedback network connected between the amplifier output and the other amplifier input,
one of said feedback networks being a negative feedback network, and
a current limiter element forming a part of the negative feedback network and being active as a controllable one-port network connected between the amplifier negative feedback input and a fixed potential, wherein
the frequency determining network comprises a parallel resonant network connected between the positive feedback input of the differential amplifier and the fixed potential.
a series arrangement of two impedances is connected between the two inputs of the differential amplifier, and
a load is coupled between the output of the differential amplifier and a junction point of the impedances.

16. An oscillator circuit as claimed in claim 15 wherein the ratio of the impedance values of the first and the second impedance is frequency-independent.

17. An oscillator circuit comprising:
a differential amplifier having a negative feedback input, a positive feedback input and an output,
a first feedback network connected between the amplifier output and one input of the amplifier, said first network determining the frequency of an oscillation generated by the oscillator circuit,
a second feedback network connected between the amplifier output and the other amplifier input,
one of said feedback networks being a negative feedback network, and
a current limiter element forming a part of the negative feedback network and being active as a controllable one-port network connected between the amplifier negative feedback input and a fixed potential, and wherein
the frequency-determining network comprises a parallel resonant network connected between the amplifier output and the negative feedback input of the differential amplifier, and
the second feedback network comprises a first impedance connected between the output and the positive feedback input of the differential amplifier and a second impedance connected between the positive feedback input and the fixed potential.

18. An oscillator circuit as claimed in claim 17 wherein a voltage developed between the output of the differential amplifier and the fixed potential is the output signal of the circuit.

19. An oscillator circuit as claimed in claim 17 wherein the ratio of the impedance values of the first and the second impedance is frequency-independent.

20. An oscillator circuit comprising: a differential amplifier having a negative feedback input, a positive feedback input and an output, a first feedback network for determining the frequency of a generated oscillation, means connecting said first feedback network between the amplifier output and one of the inputs of the amplifier, a second feedback network connected between the amplifier output and the other input of the amplifier, one of said feedback networks being a negative feedback network, a limiter element forming a part of the negative feedback nentwork, said limiter element effectively comprising a non-linear resistor device connected between the negative feedback input of the differential amplifier and a fixed potential, wherein the limiter element exhibits an abrupt change in its current versus voltage transfer characteristic such that in operation current flows therethrough in opposite directions at substantially the same limit value during the two halves of the period of the generated oscillation, which limit value is adjustable for adjusting the amplitude of the generated oscillation.

* * * * *